US008510584B1

(12) United States Patent
Wright

(10) Patent No.: US 8,510,584 B1
(45) Date of Patent: *Aug. 13, 2013

(54) ULTRA LOW POWER SLEEP MODE

(75) Inventor: David G. Wright, San Diego, CA (US)

(73) Assignee: Luciano Processing L.L.C., Dover, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/296,977

(22) Filed: Nov. 15, 2011

Related U.S. Application Data

(63) Continuation of application No. 12/005,950, filed on Dec. 28, 2007, now Pat. No. 8,060,767.

(60) Provisional application No. 60/906,605, filed on Mar. 12, 2007.

(51) Int. Cl.
*G06F 1/32* (2006.01)

(52) U.S. Cl.
USPC .......................................... 713/323; 713/320

(58) Field of Classification Search
USPC ..................... 713/320, 323, 324; 711/109
See application file for complete search history.

(56) References Cited

U.S. PATENT DOCUMENTS

| 4,656,553 A | 4/1987 | Brown |
| 4,668,932 A | 5/1987 | Drori |
| 4,727,514 A | 2/1988 | Bhuva |
| 4,734,885 A | 3/1988 | Luich |
| 4,810,948 A | 3/1989 | Takuma |
| 5,006,974 A | 4/1991 | Kazerounian et al. |
| 5,014,097 A | 5/1991 | Kazerounian et al. |
| 5,163,146 A | 11/1992 | Antanaitis, Jr. et al. |
| 5,168,463 A | 12/1992 | Ikeda |
| 5,336,951 A | 8/1994 | Josephson |
| 5,336,986 A | 8/1994 | Allman |
| 5,369,703 A | 11/1994 | Archibald |
| 5,376,834 A | 12/1994 | Carobolante |
| 5,418,969 A | 5/1995 | Matsuzaki |
| 5,444,412 A | 8/1995 | Kowalski |
| 5,481,549 A | 1/1996 | Tokuyama |

(Continued)

FOREIGN PATENT DOCUMENTS

EP 0 619 548 10/1994

OTHER PUBLICATIONS

U.S. Appl. No. 12/005,768: "Intelligent Power Supervisor," David G. Wright, filed Dec. 27, 2002; 43 pages.

(Continued)

*Primary Examiner* — Glenn A Auve
(74) *Attorney, Agent, or Firm* — Stolowitz Ford Cowger LLP

(57) ABSTRACT

An integrated circuit in accordance with one embodiment of the invention can include a plurality of storage elements that can be coupled in a first mode and a second mode. The first mode includes the plurality of storage elements being coupled to enable normal operation of the integrated circuit, and the second mode includes the plurality of storage elements being coupled together as a shift register. The integrated circuit also includes a rewritable non-volatile memory and a sleep controller that is coupled to the rewritable non-volatile memory. The sleep controller is for switching the plurality of storage elements between the first mode and the second mode. The sleep controller is for extracting data from the plurality of storage elements in the second mode and storing the data with the non-volatile memory to record the operating state of the plurality of storage elements in the first mode.

20 Claims, 3 Drawing Sheets

(56) References Cited

U.S. PATENT DOCUMENTS

| | | |
|---|---|---|
| 5,546,568 A | 8/1996 | Bland et al. |
| 5,594,442 A | 1/1997 | Paulos |
| 5,596,532 A | 1/1997 | Cernea |
| 5,629,635 A | 5/1997 | Reno |
| 5,661,685 A | 8/1997 | Lee |
| 5,664,205 A | 9/1997 | O'Brien |
| 5,693,570 A | 12/1997 | Cernea |
| 5,699,063 A | 12/1997 | Takayama |
| 5,726,995 A | 3/1998 | Wong |
| 5,744,944 A | 4/1998 | Danstrom |
| 5,748,684 A | 5/1998 | Sanchez |
| 5,838,950 A | 11/1998 | Young |
| 5,877,719 A | 3/1999 | Matsui |
| 5,878,234 A | 3/1999 | Dutkiewicz |
| 5,925,110 A | 7/1999 | Klein |
| 6,038,400 A | 3/2000 | Bell |
| 6,105,155 A | 8/2000 | Cheng |
| 6,137,188 A | 10/2000 | Mitchell et al. |
| 6,177,785 B1 | 1/2001 | Lee |
| 6,182,163 B1 | 1/2001 | Yamashita |
| 6,191,614 B1 | 2/2001 | Schultz |
| 6,191,971 B1 | 2/2001 | Tanaka |
| 6,195,712 B1 | 2/2001 | Pawlowski |
| 6,229,352 B1 | 5/2001 | Chevallier |
| 6,253,268 B1 | 6/2001 | Björkengren |
| 6,256,240 B1 | 7/2001 | Shinozaki |
| 6,260,139 B1 | 7/2001 | Alfke |
| 6,281,716 B1 | 8/2001 | Mihara |
| 6,298,448 B1 | 10/2001 | Shaffer |
| 6,316,988 B1 | 11/2001 | Forehand et al. |
| 6,320,809 B1 | 11/2001 | Raad |
| 6,321,282 B1 | 11/2001 | Horowitz |
| 6,330,231 B1 | 12/2001 | Bi |
| 6,366,224 B2 | 4/2002 | Cliff |
| RE37,708 E | 5/2002 | Danstrom |
| 6,400,605 B1 | 6/2002 | Adkins |
| 6,429,682 B1 | 8/2002 | Schultz |
| 6,499,123 B1 | 12/2002 | McFarland |
| 6,509,845 B1 | 1/2003 | Tanaka |
| 6,570,428 B1 | 5/2003 | Liao |
| 6,577,157 B1 | 6/2003 | Cheung |
| 6,577,175 B2 | 6/2003 | Kim |
| 6,603,280 B2 | 8/2003 | Notohara |
| 6,683,481 B1 | 1/2004 | Zhou |
| 6,697,292 B1 | 2/2004 | Fukuda |
| 6,798,254 B2 | 9/2004 | Marshall |
| 6,854,067 B1 | 2/2005 | Kutz |
| 6,865,113 B2 | 3/2005 | Voicu |
| 6,912,605 B1 | 6/2005 | Wright |
| 6,912,606 B2 | 6/2005 | Fay |
| 6,924,790 B1 | 8/2005 | Bi |
| 6,958,947 B2 | 10/2005 | Park |
| 6,999,342 B2 | 2/2006 | Ooishi |
| 7,012,558 B1 | 3/2006 | Arimura |
| 7,023,458 B2 | 4/2006 | Kudo |
| 7,030,668 B1 | 4/2006 | Edwards |
| 7,071,664 B1 | 7/2006 | Teggatz et al. |
| 7,089,133 B1 | 8/2006 | Williams |
| 7,089,434 B2 | 8/2006 | Kuo |
| 7,096,137 B2 | 8/2006 | Shipton |
| 7,107,178 B2 | 9/2006 | Won |
| 7,142,009 B1 | 11/2006 | Watt et al. |
| 7,174,144 B2 | 2/2007 | Lin |
| 7,176,726 B2 | 2/2007 | Bock |
| 7,221,200 B1 | 5/2007 | Kotra |
| 7,224,801 B2 | 5/2007 | Abdo |
| 7,228,476 B2 | 6/2007 | Scipioni |
| 7,269,780 B2 | 9/2007 | Arima |
| 7,304,923 B2 | 12/2007 | Sano |
| 7,310,757 B2 | 12/2007 | Ngo |
| 7,315,158 B1 | 1/2008 | Matsui |
| 7,345,944 B1 | 3/2008 | Jenkins, IV |
| 7,382,676 B2 | 6/2008 | Ballweber et al. |
| 7,385,418 B2 | 6/2008 | Speers et al. |
| 7,392,409 B2 | 6/2008 | Tateyama |
| 7,392,447 B2 * | 6/2008 | Tang et al. .................... 714/726 |
| 7,403,051 B1 | 7/2008 | Lesea |
| 7,415,624 B2 | 8/2008 | Miller |
| 7,415,647 B2 | 8/2008 | Yee |
| 7,421,291 B2 | 9/2008 | Karaoguz |
| 7,424,553 B1 | 9/2008 | Borrelli |
| 7,439,782 B2 | 10/2008 | Kamoshida |
| 7,449,926 B2 | 11/2008 | Sakai |
| 7,453,295 B2 | 11/2008 | Hotaka |
| 7,496,692 B2 | 2/2009 | Holm |
| 7,508,242 B2 | 3/2009 | Tokuno |
| 7,515,148 B2 | 4/2009 | Lee |
| 7,532,056 B2 | 5/2009 | Seo |
| 7,579,895 B2 | 8/2009 | Sun |
| 7,589,584 B1 | 9/2009 | Bui |
| 7,619,402 B1 | 11/2009 | Kwong |
| 7,626,576 B2 | 12/2009 | Anandakumar |
| 7,672,258 B1 | 3/2010 | Wu |
| 7,673,194 B1 | 3/2010 | Sun |
| 7,679,411 B2 | 3/2010 | Sakai |
| 7,679,964 B2 | 3/2010 | Lee |
| 7,710,939 B2 | 5/2010 | Shao |
| 7,739,529 B2 | 6/2010 | Hardman |
| 7,760,655 B2 | 7/2010 | Wilhelm |
| 7,795,893 B2 | 9/2010 | Agatsuma |
| 7,802,212 B2 | 9/2010 | Best |
| 7,844,308 B2 | 11/2010 | Rhee |
| 7,929,716 B2 | 4/2011 | Niwa |
| 8,058,910 B1 | 11/2011 | Wright |
| 8,058,911 B1 | 11/2011 | Wright |
| 8,060,661 B1 | 11/2011 | Wright |
| 8,060,767 B1 * | 11/2011 | Wright .................... 713/323 |
| 8,072,247 B1 | 12/2011 | Wright |
| 8,089,306 B1 | 1/2012 | Wright |
| 2002/0080967 A1 | 6/2002 | Abdo et al. |
| 2002/0108011 A1 | 8/2002 | Tanha |
| 2003/0031320 A1 | 2/2003 | Fan et al. |
| 2003/0074364 A1 | 4/2003 | Sewall |
| 2003/0093751 A1 | 5/2003 | Hohl |
| 2003/0103405 A1 | 6/2003 | Mano |
| 2003/0120922 A1 | 6/2003 | Sun |
| 2004/0029621 A1 | 2/2004 | Karaoguz |
| 2004/0088630 A1 * | 5/2004 | Arima et al. .................... 714/744 |
| 2004/0218762 A1 | 11/2004 | Le Saint et al. |
| 2005/0052437 A1 | 3/2005 | Hudson |
| 2005/0071730 A1 | 3/2005 | Moyer |
| 2005/0074051 A1 | 4/2005 | Won |
| 2005/0093572 A1 | 5/2005 | Sun et al. |
| 2005/0093582 A1 | 5/2005 | Bock |
| 2005/0195664 A1 * | 9/2005 | Ooishi .................... 365/194 |
| 2005/0243059 A1 | 11/2005 | Morris et al. |
| 2006/0035590 A1 | 2/2006 | Morris |
| 2006/0095802 A1 * | 5/2006 | Dhong et al. .................... 713/320 |
| 2006/0117230 A1 | 6/2006 | Scipioni |
| 2006/0125760 A1 | 6/2006 | Jee |
| 2006/0212838 A1 | 9/2006 | Carson |
| 2006/0227082 A1 | 10/2006 | Ogata |
| 2006/0236147 A1 | 10/2006 | Best |
| 2006/0279498 A1 | 12/2006 | Kaneda et al. |
| 2007/0094420 A1 | 4/2007 | Holm |
| 2007/0147381 A1 | 6/2007 | Wilhelm |
| 2007/0183205 A1 | 8/2007 | Lee |
| 2007/0263872 A1 | 11/2007 | Kirkup et al. |
| 2008/0071972 A1 * | 3/2008 | Kimura .................... 711/103 |
| 2008/0074361 A1 | 3/2008 | Lee |
| 2008/0086626 A1 | 4/2008 | Jones |
| 2008/0106309 A1 | 5/2008 | Abe |
| 2009/0167093 A1 | 7/2009 | Nguyen |
| 2009/0285344 A1 | 11/2009 | Boerstler |
| 2009/0315582 A1 | 12/2009 | Agatsuma |

OTHER PUBLICATIONS

USPTO Non-Final Rejection for U.S. Appl. No. 12/005,950 dated Feb. 17, 2011; 9 pages.

USPTO Non-Final Rejection for U.S. Appl. No. 12/005,950 dated Sep. 13, 2010; 8 pages.

USPTO Notice of Allowance for U.S. Appl. No. 12/005,950 dated Jun. 27, 2011; 5 pages.

Stolowitz Ford Cowger LLP; Related Case Listing; Mar. 25, 2013; 1 Page.

Baldoni, et al., "Properties of Communication Modes in Distributed Systems," Algorithms and Architectures for Parallel Processing, 1995, ICAPP95, IEEE First ICA/sup3/PP., IEEE First International Conference on, vol. 2, No., pp. 501-504, vol. 2, Apr. 19-21, 1995, doi: 10.1109/ICAPP.1995.472232; 4 pages.

National Semiconductor, "54150/DM54150/DM741150, 54151A/DM54151A/DM74151A Data Selectors/Multiplexers," Datasheet, Jun. 1989, downloaded from <www.DatasheetCatalog.com>, pp. 1-10; 11 pages.

The Authoritative Dictionary of IEEE Standard Terms, Seventh Edition, 2000, (selected definitions) ISBN 0738126012; 6 pages.

Wong, et al., "Flexible Test Mode Design for DRAM Characterization," 1996 Symposium on VLSI Circuits Digest of Technical Papers, vol., No., pp. 194-195, Jun. 13-15, 1996, doi: 10.1109/VLSIC. 1996. 507768; 2 pages.

* cited by examiner

ULTRA LOW POWER SLEEP MODE

RELATED APPLICATIONS

This application is a continuation of U.S. Non-Provisional application Ser. No. 12/005,950 filed Dec. 28, 2007, now U.S. Pat. No. 8,060,767 issued on Nov. 15, 2011 which claims the benefit of U.S. Provisional Application No. 60/906,605 filed on Mar. 12, 2007 both of which are incorporated herein by reference.

BACKGROUND

Integrated circuits that enter low power or sleep modes conventionally leave power on to internal registers, memory devices, low voltage detection circuits, and the like, in order to preserve the state of the device. Therefore, even in sleep modes, integrated circuit systems can still consume at least 100 nanoamperes (nA) of power due to systems remaining powered along with leakage current. For certain battery powered devices, this level of power consumption is unacceptable.

One conventional way for dealing with this problem is to use non-volatile memory, e.g., electrically erasable programmable read only memory (EEPROM). For example, before a central processing unit (CPU) enters a sleep mode it can store various amounts of state information to a non-volatile memory, like EEPROM. After which, the CPU enters into a low current or no current sleep mode that may not include a supply voltage monitor since the information is stored to non-volatile memory. However, one of the problems associated with this conventional solution is the latency to resume when the device wakes up from the sleep mode.

As such, it is desirable to address one or more of the above issues.

SUMMARY

An integrated circuit in accordance with one embodiment of the invention can include a plurality of storage elements that can be coupled in a first mode and a second mode. The first mode includes the plurality of storage elements being coupled to enable normal operation of the integrated circuit, and the second mode includes the plurality of storage elements being coupled together as a shift register. The integrated circuit also includes a rewritable non-volatile memory and a sleep controller that is coupled to the rewritable non-volatile memory. The sleep controller is for switching the plurality of storage elements between the first mode and the second mode. The sleep controller is for extracting data from the plurality of storage elements in the second mode and storing the data with the non-volatile memory to record the operating state of the plurality of storage elements in the first mode.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Unless specifically stated otherwise as apparent from the following discussions, it is appreciated that throughout the present detailed description, discussions utilizing terms such as "detecting", "changing", "switching", "determining", "extracting", "storing", "restricting", "allowing", "setting", "programming", "utilizing", "presenting", "loading", "producing", "reading", "writing", "retrieving", "outputting", or the like, can refer to the actions and processes of an electronic and/or electrical computing device, but is not limited to such. The computing device can manipulate and transform data represented as physical (electronic) quantities within the computing device's registers and/or memories into other data similarly represented as physical quantities within the computing device memories and/or registers or other such information storage or transmission.

Figure 1:
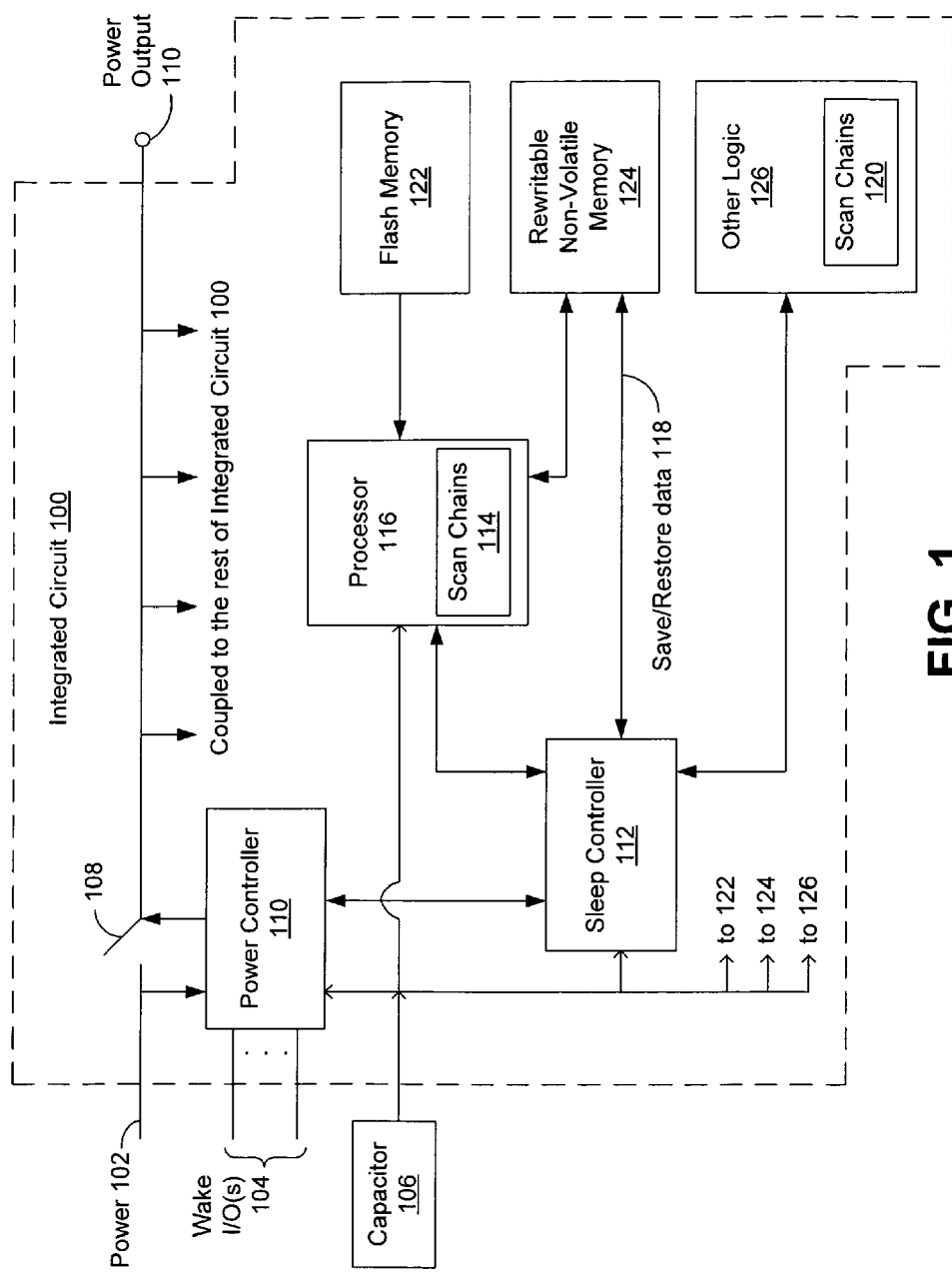
FIG. 1 is a block diagram of an exemplary integrated circuit in accordance with various embodiments of the invention.

FIG. 1 is block diagram of an exemplary integrated circuit 100 in accordance with various embodiments of the invention. In an embodiment, the integrated circuit 100 can enter an ultra low power sleep mode in which power to it can be completely removed except for a power controller circuit 110 which can remain powered to detect a wake event (e.g., interrupt request) for the integrated circuit 100. Before the integrated circuit 100 is placed into this sleep state, internal scan chains (e.g., 114 and/or 120) can be used to capture the state of the integrated circuit 100 and then be stored by the rewritable non-volatile memory 124. With the state of the integrated circuit 100 stored, the components of the integrated circuit 100 (except for the power controller 110) can be completely powered off by the power controller 110. A wake-up event (e.g., an external reset or interrupt signal applied to the power controller 110) can awaken the integrated circuit 100. At wake-up, the power controller 110 can allow power to be restored to the integrated circuit 100. Furthermore, the state of the integrated circuit 100 can be read from the rewritable non-volatile memory 124 and loaded into the scan chains 114 and/or 120. After which, the mode of the scan chains 114 and/or 120 can then be switched thereby enabling the integrated circuit 100 to resume normal operations. In an embodiment, the scan chains 114 and/or 120 along with rewritable non-volatile memory 124 can be utilized to retrieve and to restore the state of the integrated circuit 100 during normal operations.

It is pointed out that conventionally scan chains of an integrated circuit are used during a test mode for purposes of testing the integrated circuit. Conversely, in various embodiments in accordance with the invention, the scan chain mode can be initiated during expected normal operating conditions of the integrated circuit (e.g., 100). For example, one of the expected normal operating conditions of the integrated circuit can include, but is not limited to, the integrated circuit entering a sleep mode.

Within FIG. 1, during normal operation of the integrated circuit 100, a trigger event can be detected by the sleep controller 112, which can cause the sleep controller 112 to begin a process for putting the integrated circuit 100 into an ultra low power sleep mode. It is noted that the trigger event can be implemented in a wide variety of ways. For example in one embodiment, the trigger event can be, but is not limited to, the processor 116 communicating an initiation of the sleep mode to the sleep controller 112. Note that in an embodiment, the processor 116 can do either through some computations decide to enter a sleep mode or the processor 116 can receive some instruction from somewhere to enter a sleep mode. In an embodiment, the trigger event can be, but is not limited to, a power failure or an interruption of the power supply 102 to the integrated circuit 100 that can be detected by the sleep controller 112. As part of the process for entering the sleep mode, the processor 116 can set some bits in a register, as an instruction to the sleep controller 112 to configure the integrated circuit 100 into a sleep state, and then the processor 116 will halt. The halting of the Processor 116 can be implemented by an atomic instruction or in other cases it may be a sequence of instructions, but is not limited to such.

Within FIG. 1, once the processor 116 is halted, the sleep controller circuit 112 can switch the mode of the scan chains 114 and 120 from normal operating mode into a scan mode. In response to this switch, in one embodiment, the multiple storage elements (e.g., flip-flops) that can form each of the scan chains 114 and 120 change from one type of coupling into another type of coupling (or connections), thereby forming one or more serial shift registers. After which, the sleep controller can serially read out the data from the storage elements using the scan chains 114 and 120 and then store that data into the rewritable non-volatile memory 124. In this manner, the sleep controller circuit 112 retrieves the state of all the storage elements in the integrated circuit 100 using the scan chains 114 and 120. In one embodiment, the rewritable non-volatile memory 124 may include a non-volatile static random access memory (NVSRAM), e.g., as described herein. As such, in this embodiment, the sleep controller 112 can instruct the rewritable non-volatile memory 124 to then backup or store the data held in its volatile storage portion (e.g., RAM) into its non-volatile storage portion (e.g., flash memory). Once the data has been backup or stored by the rewritable non-volatile memory 124, the sleep controller circuit 112 can transmit an instruction to the power controller circuit 110 that instructs it to open switch 108, thereby turning off the power supply 102 to all the components of the integrated circuit 100 (expect for the power controller 110).

With the integrated circuit 100 in the low power sleep mode, the power controller 110 can detect a wake (or wake-up) event for the integrated circuit 100. It is noted that the wake event can be implemented in a wide variety of ways. For example in one embodiment, the wake event can be the reception of a signal via one or more wake I/O pins 104 of the integrated circuit 100. Upon detection of the wake event, the power controller 110 closes the switch 108 which then supplies the power 102 to the components of the integrated circuit 100. In one embodiment, the sleep controller 112 can read out the state data from the rewritable non-volatile memory 124 and then load it into the plurality of storage elements of the scan chains 114 and 120. It is pointed out that the state data may have been previously stored by the rewritable non-volatile memory 124 to record (or store) the operating state of scan chains 114 and 120 in their normal operating mode before the integrated circuit 100 entered into the low power sleep mode. Once loaded, the sleep controller 112 can change (or switch) the mode of the scan chains 114 and 120 from the scan mode into the normal operating mode. The sleep controller 112 can then signal the processor 116 to begin operating (or running), thereby resuming the operating state of the integrated circuit 100 and the plurality of storage elements of the scan chains 114 and 120 in their normal operating mode before the integrated circuit 100 entered the low power sleep mode. In other words, when the storage elements (e.g., flip flops) of the scan chains 114 and 120 are each loaded with the state data from the rewritable non-volatile memory 124, each storage element is returned to the state it was in before the integrated circuit 100 entered the low power sleep mode.

In an embodiment of FIG. 1, the rewritable non-volatile memory 124 may include a non-volatile static random access memory (NVSRAM), e.g., as described herein. As such, in this embodiment, the sleep controller 112 can then instruct the rewritable non-volatile memory 124 to restore the state data stored in its non-volatile storage portion into its volatile memory portion. Once the state data has been stored into the volatile memory portion of the rewritable non-volatile memory 124, the sleep controller 112 can read out the state data from the rewritable non-volatile memory 124 and then load it into the plurality of storage elements of the scan chains 114 and 120. Note that the storage elements of scan chains 114 and 120 are currently in the scan mode thereby enabling the sleep controller 112 to serially load the state data into the storage elements of the scan chains 114 and 120. Once loaded, the sleep controller 112 can change (or switch) the mode of the scan chains 114 and 120 from the scan mode into the normal operating mode. The sleep controller 112 can then signal the processor 116 to begin operating (or running), thereby resuming the operating state of the integrated circuit 100 and the plurality of storage elements of the scan chains 114 and 120 in their normal operating mode before the integrated circuit 100 entered the low power sleep mode. In other words, when the storage elements (e.g., flip flops) of the scan chains 114 and 120 are each loaded with the state data from the rewritable non-volatile memory 124, each storage element is returned to the state it was in before the integrated circuit 100 entered the low power sleep mode.

Within FIG. 1, it is noted that in one embodiment, the storage elements (e.g., flip-flops) that form the scan chains 114 and 120 have a normal operating mode and a scan mode, as described herein. For example in an embodiment, there may be eight storage elements of scan chain 114 that in normal operating mode are coupled to function as a state machine during normal operations of the integrated circuit 100. However, when the sleep controller 112 switches the eight storage elements of scan chain 114 into the scan mode during normal operations of the integrated circuit 100, those eight storage elements that form the state machine cease to be coupled together to perform the function of the state machine and are now coupled together to form a serial shift register. At that time the eight storage elements still contain the data that they were holding at the time that a sleep instruction was executed during normal operations of the integrated circuit 100. As such, the sleep controller 112 can clock the scan chain to extract the state data from the eight storage elements of the scan chain 114. Therefore, the intercouplings of the eight storage elements of the scan chain 114 are changes when they are switched by the sleep controller 112 from the normal operating mode into the scan mode, and vice versa.

In one embodiment, the trigger event to begin the process to enter into the low power sleep mode can be a power failure or an interruption of the power supply 102 to the integrated circuit 100 that can be detected by the sleep controller 112. In such a situation, the capacitor 106 can be coupled to the power controller 110, the sleep controller 112, the flash memory 122, the rewritable non-volatile memory 124, the processor 116, and the other logic 126 in order to provide temporary power to these components so that the data held by the scan chains 114 and 120 can be backed-up (or stored) by the rewritable non-volatile memory 124. Therefore, when the sleep controller 112 detects the power failure or interruption to the power supply 102, the sleep controller 112 can be powered by the capacitor 106 so that it can operate automatically in manner similar to that described herein. Furthermore, the rewritable non-volatile memory 124, the processor 116, the other logic 126, and the scan chains 114 and 120 can be powered by the capacitor 106 so that they can each operate automatically in a manner similar to that described herein such that the state data of the scan chains can be stored by the rewritable non-volatile memory 124. Additionally, when the power supply 102 is restored to the integrated circuit 100, with a short delay, the sleep controller 112 can operate in a manner similar to that described herein to restore the state of the integrated circuit 100 just before the power 102 was interrupted or taken away. In this manner, the backup capacitor 106 is able to produce an auxiliary power supply that allows the state data to be backed-up after the main power supply 102 has been removed from the integrated circuit device 100. The backup capacitor 106 can be implemented in a wide variety of ways. For example, the backup capacitor 106 can be implemented with approximately 50 to 100 microfarads, but is not limited to such. It is noted that in one embodiment, the backup capacitor 106 can be external to the integrated circuit 100.

It is noted that the integrated circuit 100 of FIG. 1 can be implemented in a wide variety of ways. For example in an embodiment, the integrated circuit 100 can be implemented as, but is not limited to, a microcontroller or any digital integrated circuit. The integrated circuit 100 can include, but is not limited to, a power controller circuit 110, a sleep controller circuit 112, a processor 116, a flash memory 122, a rewritable non-volatile memory 124, and other logic 126. In one embodiment, the processor 116 can include one or more scan chains 114. In an embodiment, the other logic 126 can include one or more scan chains 120. It is pointed out that scan chains 114 and 120 can each be implemented in a wide variety of ways. For example in an embodiment, scan chains 114 and 120 can each include a plurality of storage elements (e.g., flip-flops) that can be coupled both in a normal operating mode and also in a scan mode. Specifically, in the normal operating mode, the plurality of storage elements of the scan chains 114 (or 120) can be activated to be coupled to enable normal operation of the integrated circuit 100. Additionally, in the scan mode the plurality of storage elements of the scan chains 114 (or 120) can each be activated to be coupled together as a serial shift register.

Within FIG. 1, the rewritable non-volatile memory 124 can be implemented in a wide variety of ways. For example, the rewritable non-volatile memory 124 can implemented as flash memory, a combination of volatile random access memory (RAM) and non-volatile memory, non-volatile static random access memory (NVSRAM), and the like. It is pointed out that in one embodiment, the NVSRAM that can be utilized to implement the rewritable non-volatile memory 124 can be a type of memory were each bit of memory is associated with two different storage technologies. For example, for each memory bit there is volatile RAM cell and a (non-volatile) flash memory cell. Since there is a one-to-one correspondence between the RAM cells and the flash memory cell, the memory array of the NVSRAM can be set up such that all of its RAM cells can simultaneously store (or write) their contents into its flash memory bits. In this manner, a backup storage of the contents of the RAM cells is stored with the flash memory cells in a small amount of time. Furthermore, the memory array of the NVSRAM can be set up such that all of its RAM cells can simultaneously retrieve (or read) their contents from its flash memory cells.

A power supply 102 can be coupled to the integrated circuit 100. Specifically, the power supply 102 can be coupled to the power controller 110 and a switch 108, which can be controlled by the power controller 110. It is pointed out that the power supply 102 can be supplied to the rest of the chip through the switch 108. As such, when the power controller 110 opens the switch 108, the power supply 102 is prevented or restricted from reaching the sleep controller 112, the processor 116, the flash memory 122, the rewritable non-volatile memory 124, and the other logic 126 of the integrated circuit 100. Note that the power controller 110 remains coupled to the power supply 102 even after it opens the switch 108. As part of a process for entering the integrated circuit 100 into the ultra low power sleep mode in accordance with an embodiment, the power controller 110 can open the switch 108. It is pointed out that since there is no voltage 102 being supplied to the rest of the integrated circuit 100, there is no leakage current associated with the rest of the integrated circuit 100 during the sleep mode. In one embodiment, the power controller 110 can be implemented with two interfaces. Specifically, one interface is a sleep interface that is coupled to the sleep controller circuit 112, which the sleep controller 112 can use to instruct the power controller 110 to open the switch 108 and thus put the integrated circuit device 100 into the low power sleep mode. The other interface of the power controller 110 is a wake-up interface that can include one or more wake input/output (I/O) pins 104 of the integrated circuit 100 where a voltage or changed voltage can instruct the power controller 110 to close the switch 108 and start supplying power to the rest of the integrated circuit 100.

Within FIG. 1, note that the integrated circuit 100 can include a processor 116 that can include one or more scan chains 114. The processor 116 can be implemented in a wide variety of ways. For example in one embodiment, the processor 116 can be implemented as a central processing unit (CPU), but is not limited to such. The integrated circuit 100 can include the flash memory 122 that can store instructions for the integrated circuit 100. The flash memory 122 can be implemented in a wide variety of ways. For example in an embodiment, the flash memory 122 can be substituted with any type of rewriteable non-volatile memory. In one embodiment, flash memory 122 may not be included as part of the integrated circuit 100. As such, the instructions for the integrated circuit 100 can be stored by the rewritable non-volatile memory 124. It is noted that the integrated circuit 100 can also include other logic circuitry 126, which can include one or more scan chains 120, which can be implemented in any manner similar to that described herein.

It is pointed out that when the integrated circuit 100 is in a low power sleep mode, the integrated circuit 100 would consume approximately a few nanoamperes of current, which would be associated with the power controller 110 that would remain powered during the low power sleep mode. In one embodiment, one or two I/O pins (e.g., 102 and/or 104) of the integrated circuit 100 can remain powered during the low power sleep mode.

Within FIG. 1, the power controller 110 of the integrated circuit 100 can be coupled to receive the power supply 102 and is coupled to wake I/O pin(s) 104. Furthermore, the power controller 110 can be coupled to control the operation of the switch 108 and the power controller 110 can be coupled to the backup capacitor 106. The sleep controller 112 can be coupled to the capacitor 106, power controller 110, processor 116, scan chains 114, rewritable non-volatile memory 124, the other logic 126, and the scan chains 120. Furthermore, the flash memory 122 can be coupled to the processor 116 and the backup capacitor 106. The processor 116 can be coupled to the rewritable non-volatile memory 124 and the backup capacitor 106. Moreover, the sleep controller 112, processor 116, flash memory 122, rewritable non-volatile memory 124, and the other logic 126 can all be coupled to the switch 108 in order to receive the power supply 102 when the switch 108 is closed. The integrated circuit 100 can also include a power output 110 that can be coupled to the switch 108 in order to receive the power supply 102 when the switch 108 is closed.

Within FIG. 1, it is understood that the integrated circuit 100 may not include all of the elements illustrated by FIG. 1. Additionally, the integrated circuit 100 can be implemented to include one or more elements not illustrated by FIG. 1.

Figure 2:
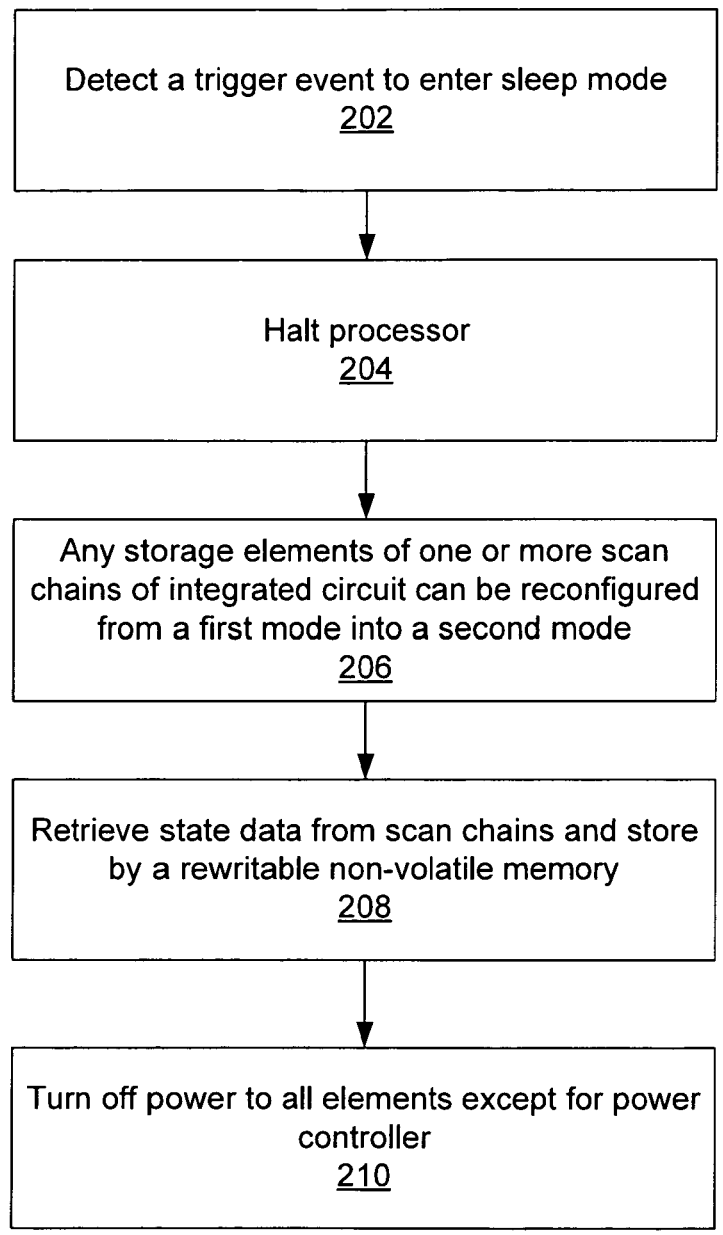
FIG. 2 is a flow diagram of an exemplary method in accordance with various embodiments of the invention.

FIG. 2 is a flow diagram of a method 200 in accordance with various embodiments of the invention for entering an ultra low power sleep mode. Method 200 includes exemplary processes of various embodiments of the invention which can be carried out by a processor(s) and electrical components under the control of computing device readable and executable instructions (or code), e.g., software. The computing device readable and executable instructions (or code) may reside, for example, in data storage features such as volatile memory, non-volatile memory and/or mass data storage that are usable by a computing device. However, the computing device readable and executable instructions (or code) may reside in any type of computing device readable medium. Although specific operations are disclosed in method 200, such operations are exemplary. Method 200 may not include all of the operations illustrated by FIG. 2. Also, method 200 may include various other operations and/or variations of the operations shown by FIG. 2. Likewise, the sequence of the operations of method 200 can be modified. It is noted that the operations of method 200 can be performed by software, by firmware, by electronic hardware, by electrical hardware, or by any combination thereof.

Specifically, method 200 can include detecting a trigger event for an integrated circuit to enter a low power sleep mode. In response to the trigger event, the operations can be halted of a processor of the integrated circuit. Any storage elements of one or more scan chains of the integrated circuit can be reconfigured from a first mode into a second mode. The state data can be retrieved from the one or more scan chains of the integrated circuit and stored by a rewritable non-volatile memory of the integrated circuit. The power can then be turned off to all elements of the integrated circuit, except for a power controller circuit.

At operation 202 of FIG. 2, a trigger event can be detected for an integrated circuit (e.g., 100) to enter a low power sleep mode. Note that operation 202 can be implemented in a wide variety of ways. For example, operation 202 can be implemented in any manner similar to that described herein, but is not limited to such.

At operation 204, in response to the trigger event, the operations can be halted of a processor (e.g., 116) of the integrated circuit. It is pointed out that operation 204 can be implemented in a wide variety of ways. For example, operation 204 can be implemented in any manner similar to that described herein, but is not limited to such.

At operation 206 of FIG. 2, any storage elements of one or more scan chains (e.g., 114 and/or 120) of the integrated circuit can be reconfigured from a first mode into a second mode. It is noted that operation 206 can be implemented in a wide variety of ways. For example in one embodiment, any storage elements of the one or more scan chains of the integrated circuit can be reconfigured from their normal operating mode into a scan mode. Operation 206 can be implemented in any manner similar to that described herein, but is not limited to such.

At operation 208, the state data can be retrieved from the one or more scan chains of the integrated circuit and stored by a rewritable non-volatile memory (e.g., 124) of the integrated circuit. Note that operation 208 can be implemented in a wide variety of ways. For example, operation 208 can be implemented in any manner similar to that described herein, but is not limited to such.

At operating 210, the power can then be turned off to all elements or components (e.g., 106, 112, 114, 116, 120, 122, 124 and 126) of the integrated circuit, except for a power controller circuit (e.g., 110). It is pointed out that operation 210 can be implemented in a wide variety of ways. For example, operation 210 can be implemented in any manner similar to that described herein, but is not limited to such. At the completion of operation 210, process 200 can be exited.

Figure 3:
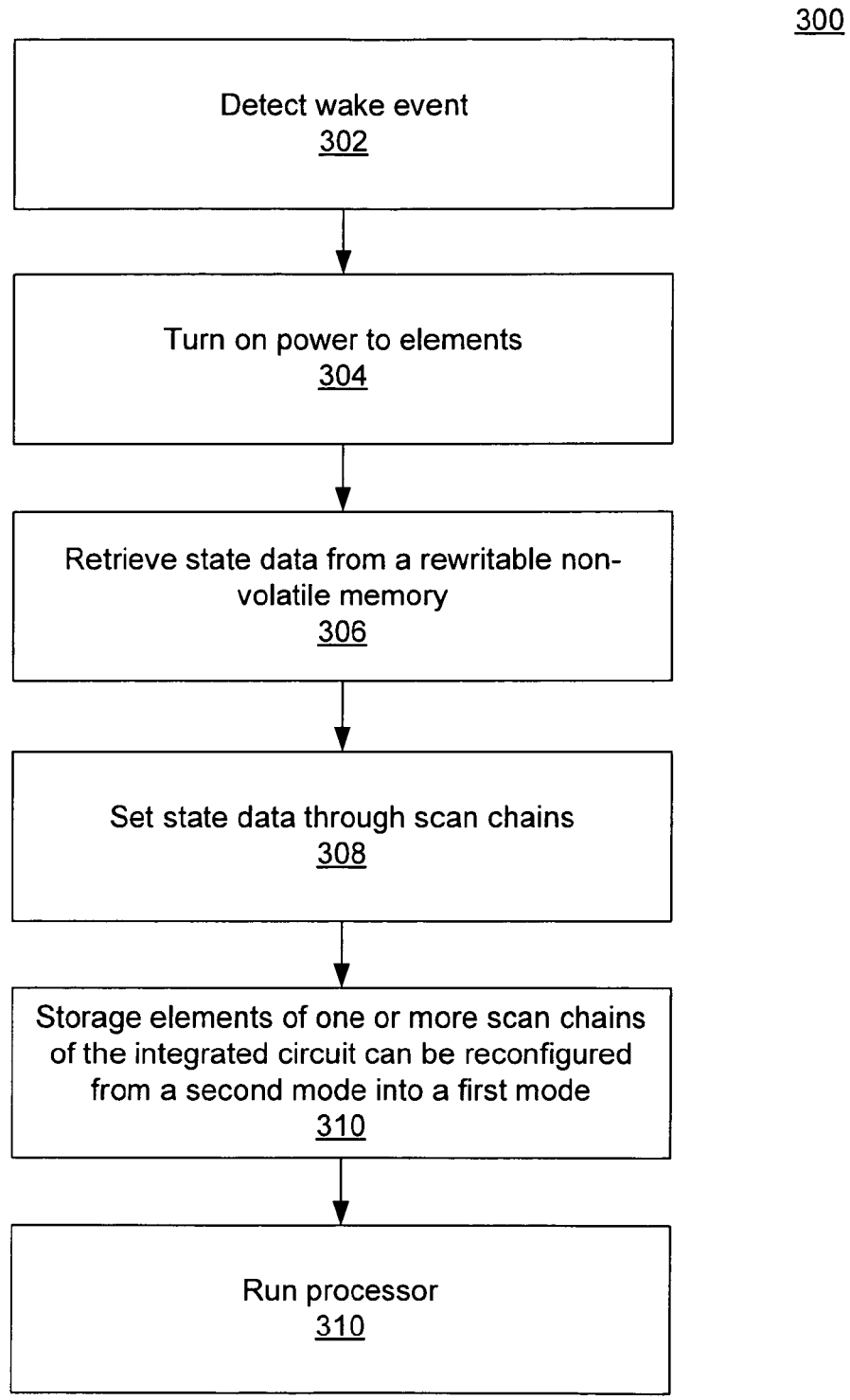
FIG. 3 is another flow diagram of an exemplary method in accordance with various embodiments of the invention.
Figure 3:
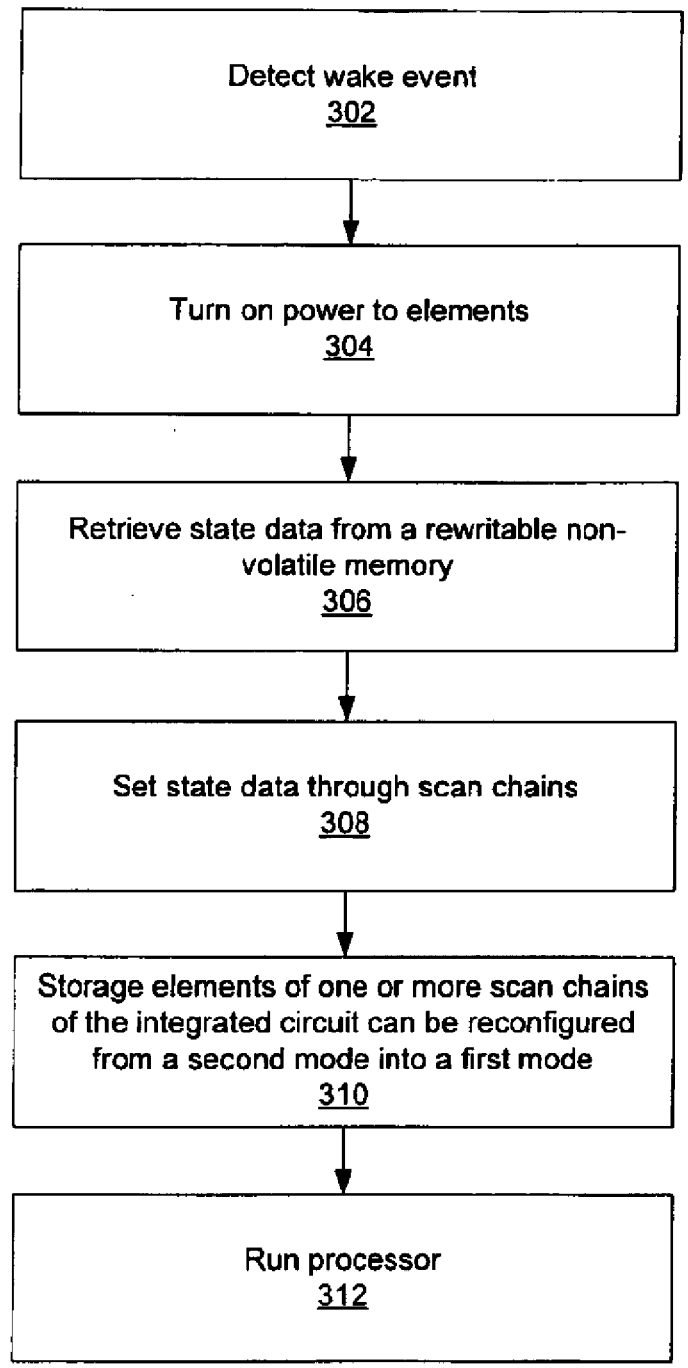

FIG. 3 is a flow diagram of a method 300 in accordance with various embodiments of the invention for exiting an ultra low power sleep mode. Method 300 includes exemplary processes of various embodiments of the invention which can be carried out by a processor(s) and electrical components under the control of computing device readable and executable instructions (or code), e.g., software. The computing device readable and executable instructions (or code) may reside, for example, in data storage features such as volatile memory, non-volatile memory and/or mass data storage that are usable by a computing device. However, the computing device readable and executable instructions (or code) may reside in any type of computing device readable medium. Although specific operations are disclosed in method 300, such operations are exemplary. Method 300 may not include all of the operations illustrated by FIG. 3. Also, method 300 may include various other operations and/or variations of the operations shown by FIG. 3. Likewise, the sequence of the operations of method 300 can be modified. It is noted that the operations of method 300 can be performed by software, by firmware, by electronic hardware, by electrical hardware, or by any combination thereof.

Specifically, method 300 can include detecting a wake event for an integrated circuit. Power is turned on or supplied to the elements or components of the integrated circuit. State data can be retrieved from a rewritable non-volatile memory of the integrated circuit. In one embodiment, the state data may have been previously stored by the rewritable non-volatile memory to record (or store) the operating state of the scan chains of the integrated circuit in their normal operating mode before the integrated circuit entered into a low power sleep mode. The state data can be set by loading the state data into and through the storage elements of the scan chains. The storage elements of one or more scan chains of the integrated circuit can be reconfigured from a second mode into a first mode. The processor can then begin running or operating.

At operation 302 of FIG. 3, a wake event can be detected for an integrated circuit (e.g., 100). Note that operation 302 can be implemented in a wide variety of ways. For example, operation 302 can be implemented in any manner similar to that described herein, but is not limited to such.

At operation 304, power is turned on or supplied to the elements or components (e.g., 106, 112, 114, 116, 120, 122, 124 and 126) of the integrated circuit. It is pointed out that operation 304 can be implemented in a wide variety of ways.

For example, operation 304 can be implemented in any manner similar to that described herein, but is not limited to such.

At operation 306 of FIG. 3, state data can be retrieved from a rewritable non-volatile memory (e.g., 124) of the integrated circuit. In one embodiment, the state data may have been previously stored by the rewritable non-volatile memory to store (or record) the operating state of one or more scan chains (e.g., 114 and/or 120) of the integrated circuit in their normal operating mode before the integrated circuit entered into a low power sleep mode. It is noted that operation 306 can be implemented in a wide variety of ways. For example, operation 306 can be implemented in any manner similar to that described herein, but is not limited to such.

At operation 308, the state data can be set by loading the retrieved state data into and through the storage elements of one or more scan chains (e.g., 114 and/or 120). It is noted that operation 308 can be implemented in a wide variety of ways. For example, operation 308 can be implemented in any manner similar to that described herein, but is not limited to such.

At operation 310 of FIG. 3, any storage elements of one or more scan chains (e.g., 114 and/or 120) of the integrated circuit can be reconfigured from a second mode into a first mode. It is noted that operation 310 can be implemented in a wide variety of ways. For example in one embodiment, any storage elements of the one or more scan chains of the integrated circuit can be reconfigured from their scan mode into their normal operating mode. Operation 310 can be implemented in any manner similar to that described herein, but is not limited to such.

At operating 312, a processor (e.g., 116) of the integrated circuit can then begin running or operating. It is pointed out that operation 312 can be implemented in a wide variety of ways. For example, operation 312 can be implemented in any manner similar to that described herein, but is not limited to such. At the completion of operation 312, process 300 can be exited.

The foregoing descriptions of various specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

What is claimed is:

1. An integrated circuit comprising:
   a plurality of storage elements having a first configuration to store data during normal operations of the integrated circuit; and
   a sleep controller configured to switch between the first configuration and a second configuration for the plurality of storage elements in response to an indication of a power mode change for the integrated circuit, wherein the sleep controller is configured to extract data from or record data to the plurality of storage elements configured as a shift register in the second configuration.

2. The integrated circuit of claim 1, further comprising:
   a power controller coupled to the sleep controller, the power controller being configured to control when power is provided to at least a portion of the integrated circuit.

3. The integrated circuit of claim 2, wherein the power controller is configured to detect a wake event for the integrated circuit and configured to allow power to flow to the integrated circuit in response to a detection of the wake event.

4. The integrated circuit of claim 3, wherein the power controller is configured to notify the sleep controller of detection of the wake event.

5. The integrated circuit of claim 2, wherein the sleep controller is configured to cause the power controller to restrict power to at least the portion of the integrated circuit.

6. The integrated circuit of claim 1, wherein the plurality of storage elements in the first configuration are coupled to function as a state machine.

7. A method comprising:
   detecting a trigger event during normal operation of an integrated circuit;
   in response to the trigger event, reconfiguring a plurality of storage elements from a first configuration into a second configuration comprising the plurality of storage elements being coupled together as a shift register;
   in response to the trigger event, extracting data from the plurality of storage elements configured as the shift register; and
   restricting power to the plurality of storage elements after extracting the data from the plurality of storage elements.

8. The method of claim 7, wherein the trigger event comprises a sleep mode initiation.

9. The method of claim 7, wherein the trigger event comprises a power interruption to the integrated circuit.

10. The method of claim 7, wherein the integrated circuit comprises a microcontroller.

11. The method of claim 7, wherein the first configuration of the plurality of storage elements comprises the plurality of storage elements being coupled to enable operation of the integrated circuit.

12. The method of claim 7, further comprising storing the data.

13. The method of claim 12, wherein storing the data records an operating state of the plurality of storage elements in the first configuration.

14. The method of claim 7, wherein during the normal operation of the integrated circuit, the plurality of storage elements are coupled to function as a state machine.

15. A method comprising:
   detecting a wake event for an integrated circuit;
   in response to the wake event, loading data into a plurality of storage elements configured as a shift register, wherein the data corresponds to an operational state for the plurality of the storage elements; and
   reconfiguring the plurality of storage elements from the shift register into a different configuration in response to the wake event and after loading the data into the plurality of the storage elements.

16. The method of claim 15, wherein the wake event comprises receiving a signal via a pin of the integrated circuit.

17. The method of claim 15, wherein the integrated circuit comprises a microcontroller.

18. The method of claim 15, wherein the plurality of storage elements comprises a scan chain.

19. The method of claim 15, further comprising resuming the operating state of the plurality of storage elements in the different configuration.

20. The method of claim 15, wherein the plurality of storage elements are coupled to function as a state machine in the different configuration.

* * * * *

UNITED STATES PATENT AND TRADEMARK OFFICE
CERTIFICATE OF CORRECTION

Page 1 of 2

PATENT NO. : 8,510,584 B1
APPLICATION NO. : 13/296977
DATED : August 13, 2013
INVENTOR(S) : Wright It is certified that error appears in the above-identified patent and that said Letters Patent is hereby corrected as shown below:

On the title page, item (56), under "OTHER PUBLICATIONS", in Column 2, Line 2, delete "Dec. 27, 2002;" and insert -- Dec. 27, 2007; --, therefor.

In the Drawings

In Fig. 3, Sheet 3 of 3, delete " Run processor 310 " and insert -- Run processor 312 --, as shown on attached page therefor.

In the Specifications

In Column 6, Line 47, delete "rewriteable" and insert -- rewritable --, therefor.

Signed and Sealed this
Sixth Day of May, 2014

Michelle K. Lee
*Deputy Director of the United States Patent and Trademark Office*